United States Patent
Okabe

(10) Patent No.: US 8,081,048 B2
(45) Date of Patent: Dec. 20, 2011

(54) BRANCHING FILTER, SEMICONDUCTOR INTEGRATED CIRCUIT DEVICE, AND COMMUNICATION MOBILE TERMINAL

(75) Inventor: Hiroshi Okabe, Tokyo (JP)

(73) Assignee: Renesas Electronics Corporation, Kanagawa (JP)

(*) Notice: Subject to any disclaimer, the term of this patent is extended or adjusted under 35 U.S.C. 154(b) by 202 days.

(21) Appl. No.: 12/474,620

(22) Filed: May 29, 2009

(65) Prior Publication Data

US 2010/0052813 A1    Mar. 4, 2010

(30) Foreign Application Priority Data

Aug. 27, 2008   (JP) .................................. 2008-218050

(51) Int. Cl.
*H03H 7/46*  (2006.01)
*H01P 5/12*  (2006.01)

(52) U.S. Cl. ......... 333/132; 333/126; 333/129; 333/175

(58) Field of Classification Search ................. 333/126, 333/129, 132, 175, 127–128, 134
See application file for complete search history.

(56) References Cited

U.S. PATENT DOCUMENTS

| | | | | |
|---|---|---|---|---|
| 5,652,599 A | * | 7/1997 | Pitta et al. | 343/858 |
| 5,969,582 A | * | 10/1999 | Boesch et al. | 333/129 |
| 6,621,376 B2 | * | 9/2003 | Liu et al. | 333/126 |
| 6,677,833 B2 | * | 1/2004 | Sheen | 333/132 |
| 7,050,769 B2 | | 5/2006 | Imai et al. | |
| 7,057,472 B2 | * | 6/2006 | Fukamachi et al. | 333/101 |
| 7,196,595 B2 | * | 3/2007 | Tsai et al. | 333/134 |
| 7,446,628 B2 | * | 11/2008 | Morris, III | 333/132 |

FOREIGN PATENT DOCUMENTS

| | | |
|---|---|---|
| JP | 2003-46452 A | 2/2003 |
| JP | 2004-32482 A | 1/2004 |

* cited by examiner

*Primary Examiner* — Robert Pascal
*Assistant Examiner* — Kimberly Glenn
(74) *Attorney, Agent, or Firm* — Mattingly & Malur, PC

(57) ABSTRACT

A technique for realizing module size reduction while enhancing the anti-ESD characteristic of a low frequency band circuit without the need to add such an element as an ESD filter. In a diplexer included in a high-frequency power amplifier module, a composite grounding inductor with respect to an antenna terminal is formed of three inductors including a series inductor contained in a lowpass filter. Since an ESD signal contains main components thereof belonging to a frequency band of the order of a few hundreds of MHz or lower, the ESD signal is allowed to pass through a lowpass filter with little to no attenuation. Under this condition, a function for ESD filtering from the antenna terminal to an antenna switch circuit is provided by using the composite grounding inductor mentioned above and an electrostatic capacitor element, thereby suppressing passage of the ESD signal to the antenna switch circuit.

15 Claims, 10 Drawing Sheets

BRANCHING FILTER, SEMICONDUCTOR INTEGRATED CIRCUIT DEVICE, AND COMMUNICATION MOBILE TERMINAL

CROSS-REFERENCE TO RELATED APPLICATIONS

The disclosure of Japanese Patent Application No. 2008-218050 filed on Aug. 27, 2008 including the specification, drawings and abstract is incorporated herein by reference in its entirety.

BACKGROUND OF THE INVENTION

The present invention relates to a technique for enhancing the performance of a high-frequency power amplifier module used in a communication mobile terminal or the like, and more particularly to a technique effectively applicable to anti-ESD (ElectroStatic Discharge) characteristic enhancement and harmonic suppression in a branching filter of the high-frequency power amplifier module.

Recent years have seen the widespread proliferation of mobile phones used as terminal units for mobile telecommunication, and at present, there is an increasing demand for implementation of more diverse functionalities in mobile phones. Regarding a high-frequency power amplifier module contained in a mobile phone, for example, it is desired to reduce the size thereof while providing refinement in harmonic suppression and enhancement in anti-ESD characteristic for wider-bandwidth communication.

In common practice, the high-frequency power amplifier module is provided with a branching filter such as a diplexer which is a filter for separating transmitting signals in transmission through an antenna and receiving signals in reception therethrough.

Thus, for example, transmitting and receiving signals of a low frequency band circuit of GSM (Global System for Mobile Communications) are prevented from straying into a high frequency band circuit of DCS (Digital Cellular System) or PCS (Personal Communication Service).

For high-frequency power amplifier modules of the above-mentioned kind, the following arrangements have been proposed: In the patent document 1 indicated below, for example, there is disclosed an arrangement in which an impedance phase relationship of two-fold higher harmonics is set up within a range of 180°±90° for a matching circuit and a lowpass filter with respect to a coupling point thereof, thereby transmitting fundamental waves with low loss while reducing two-fold higher harmonics to a desired level or below. In the patent document 2 indicated below, for example, there is disclosed an arrangement in which an ESD filter is provided between a lowpass filter of a low frequency band circuit and an antenna switch, thereby realizing favorable sensitivity of reception while removing static electricity.

Patent Document 1
Japanese Unexamined Patent Publication No. 2004-032482
Patent Document 2
Japanese Unexamined Patent Publication No. 2003-046452

SUMMARY OF THE INVENTION

However, in conventional techniques such as those mentioned above for improving the anti-ESD characteristics of a high-frequency power amplifier module, the present inventors have found the following disadvantages.

In a high-frequency power amplifier module having an antenna switch, there are provided such transistors as a pHEMT (pseudomorphic High Electron Mobility Transistor) switch and the like. However, since the pHEMT switch is vulnerable to electrostatic breakdown, it is required to improve the anti-ESD characteristic particularly in a low frequency band circuit where the passing-through of an ESD signal is likely to occur.

The reason for the condition that the ESD signal is likely to pass through the low frequency band circuit is as follows. While the main components of the ESD signal are formed in a frequency band of the order of a few hundreds of MHz or lower, only a lowpass filter allowing passage of relatively higher-frequency signals is provided in the low frequency band circuit, e.g., in a diplexer for a GSM/DCS dual-band mobile phone, there is provided only a lowpass filter that allows passage of signals having frequencies of approximately 900 MHz or lower. The ESD signal is therefore allowed to pass through the low frequency band circuit with little to no attenuation.

On the other hand, in a high frequency band circuit, e.g., in a diplexer for a GSM/DCS dual-band mobile phone, there is provided a highpass filter that allows passage of signals having frequencies of approximately 1700 MHz or higher. The ESD signal is therefore hardly allowed to pass through the high frequency band circuit in most cases.

However, in an arrangement in which an EDS filter is provided between the lowpass filter and the antenna switch as disclosed in patent document 1, the number of element devices must be increased to cause a disadvantage in module size reduction and an increase of loss in low frequency band signaling, giving rise to a problem that the efficiency of transmission is degraded.

Further, in an arrangement such as disclosed in patent document 2, when the pHEMT switch produces harmonic waves, the lowpass filter can remove the harmonic waves thus produced to some extent. However, there occurs a problem that some harmonic waves may pass through the highpass filter circuit to cause radiation thereof from the antenna.

It is therefore an object of the present invention to provide a technique for realizing module size reduction while enhancing the anti-ESD characteristic of a low frequency band circuit without the need to add such an element as an ESD filter.

The above and other objects, features and advantages of the present invention will become more apparent from the following detailed description with reference to the accompanying drawings.

Representative aspects of the present invention are briefly described below.

In carrying out the present invention and according to one aspect thereof, there is provided a branching filter comprising: a first tank circuit arranged in a parallel coupling configuration of a tank-circuit inductor and a tank-circuit electrostatic capacitor element, the first tank circuit having one coupling part thereof coupled to a first transmitting/receiving signal terminal; a first lowpass filter having one coupling part thereof coupled to the other coupling part of the first tank circuit; a first inductor having one coupling part thereof coupled to the other coupling part of the first lowpass filter, and having the other coupling part thereof coupled to a reference potential; a first electrostatic capacitor element having one coupling part thereof coupled to the other coupling part of the first lowpass filter, and having the other coupling part thereof coupled to a second transmitting/receiving signal terminal; a second lowpass filter having one coupling part thereof coupled to the first transmitting/receiving signal terminal; and a second electrostatic capacitor element having one coupling part thereof coupled to the other coupling part of the second lowpass filter, and having the other coupling part thereof coupled to a third transmitting/receiving signal terminal.

Further, according to another aspect of the present invention, there is provided a branching filter wherein the first lowpass filter comprises: a first filter-circuit inductor having one coupling part thereof coupled to the other coupling part of the first tank circuit; and a first filter-circuit electrostatic capacitor element having one coupling part thereof coupled to the other coupling part of the first filter-circuit inductor, and having the other coupling part thereof coupled to a reference potential.

Still further, according to another aspect of the present invention, there is provided a branching filter wherein the first lowpass filter comprises: a first filter-circuit inductor having one coupling part thereof coupled to the other coupling part of the first tank circuit; a first filter-circuit electrostatic capacitor element having one coupling part thereof coupled to the other coupling part of the first filter-circuit inductor; and a second filter-circuit inductor having one coupling part thereof coupled to the other coupling part of the first filter-circuit electrostatic capacitor element, and having the other coupling part thereof coupled to a reference potential.

Furthermore, according to another aspect of the present invention, there is provided a branching filter wherein the second lowpass filter comprises: a second tank circuit arranged in a parallel coupling configuration of a tank-circuit inductor and a tank-circuit electrostatic capacitor element, the second tank circuit having one coupling part thereof coupled to the first transmitting/receiving signal terminal; a third filter-circuit inductor having one coupling part thereof coupled to the other coupling part of the second tank circuit, and having the other coupling part thereof coupled to one coupling part of the first electrostatic capacitor element; a second filter-circuit electrostatic capacitor element having one coupling part thereof coupled to the other coupling part of the second tank circuit; and a fourth filter-circuit inductor having one coupling part thereof coupled to the other coupling part of the second filter-circuit electrostatic capacitor element, and having the other coupling part thereof coupled to a reference potential.

Still further, according to another aspect of the present invention, there is provided a branching filter wherein the second lowpass filter comprises: a second tank circuit arranged in a parallel coupling configuration of a tank-circuit inductor and a tank-circuit electrostatic capacitor element, the second tank circuit having one coupling part thereof coupled to the first transmitting/receiving signal terminal; a third filter-circuit inductor having one coupling part thereof coupled to the other coupling part of the second electrostatic capacitor element, and having the other coupling part thereof coupled to the third transmitting/receiving signal terminal; a second filter-circuit electrostatic capacitor element having one coupling part thereof coupled to the other coupling part of the second tank circuit; and a fourth filter-circuit inductor having one coupling part thereof coupled to the other coupling part of the second filter-circuit electrostatic capacitor element, and having the other coupling part thereof coupled to a reference potential.

Still further, according to another aspect of the present invention, there is provided a branching filter for separating at least three frequency bands, the branching filter comprising: a first tank circuit arranged in a parallel coupling configuration of a tank-circuit inductor and a tank-circuit electrostatic capacitor element, the first tank circuit having one coupling part thereof coupled to a first transmitting/receiving signal terminal; a first lowpass filter having one coupling part thereof coupled to the other coupling part of the first tank circuit; a first inductor having one coupling part thereof coupled to the other coupling part of the first lowpass filter, and having the other coupling part thereof coupled to a reference potential; a first electrostatic capacitor element having one coupling part thereof coupled to the other coupling part of the first lowpass filter, and having the other coupling part thereof coupled to a second transmitting/receiving signal terminal; a second lowpass filter having one coupling part thereof coupled to the first transmitting/receiving signal terminal; a second electrostatic capacitor element having one coupling part thereof coupled to the other coupling part of the second lowpass filter, and having the other coupling part thereof coupled to a third transmitting/receiving signal terminal; and at least one bandpass filter having one coupling part thereof coupled to the first transmitting/receiving signal terminal, and having the other coupling part thereof coupled to a fourth transmitting/receiving signal terminal for allowing passage of signals having higher frequencies than a frequency band allowed to pass through the second lowpass filter.

In addition, the following briefly describes other representative aspects of the present invention.

According to a further aspect of the present invention, there is provided a semiconductor integrated circuit device including a branching filter, the branching filter comprising: an antenna switch circuit for changing over signal paths allocated for different frequencies; a first tank circuit arranged in a parallel coupling configuration of a tank-circuit inductor and a tank-circuit electrostatic capacitor element, the first tank circuit having one coupling part thereof coupled to a first transmitting/receiving signal terminal which serves as an antenna terminal coupled to an antenna; a first lowpass filter having one coupling part thereof coupled to the other coupling part of the first tank circuit; a first inductor having one coupling part thereof coupled to the other coupling part of the first lowpass filter, and having the other coupling part thereof coupled to a reference potential; a first electrostatic capacitor element having one coupling part thereof coupled to the other coupling part of the first lowpass filter, and having the other coupling part thereof coupled to a second transmitting/receiving signal terminal coupled to the antenna switch circuit; a second lowpass filter having one coupling part thereof coupled to the first transmitting/receiving signal terminal; and a second electrostatic capacitor element having one coupling part thereof coupled to the other coupling part of the second lowpass filter, and having the other coupling part thereof coupled to a third transmitting/receiving signal terminal coupled to the antenna switch circuit.

Moreover, according to an even further aspect of the present invention, there is provided a communication mobile terminal including a high-frequency power amplifier module for performing power amplification required for signal transmission in a communication system, the high-frequency power amplifier module being arranged to have a branching filter comprising: an antenna switch circuit for changing over signal paths allocated different frequencies; a first tank circuit arranged in a parallel coupling configuration of a tank-circuit inductor and a tank-circuit electrostatic capacitor element, the first tank circuit having one coupling part thereof coupled to a first transmitting/receiving signal terminal which serves as an antenna terminal coupled to an antenna; a first lowpass filter having one coupling part thereof coupled to the other coupling part of the first tank circuit; a first inductor having one coupling part thereof coupled to the other coupling part of the first lowpass filter, and having the other coupling part thereof coupled to a reference potential; a first electrostatic capacitor element having one coupling part thereof coupled to the other coupling part of the first lowpass filter, and having the other coupling part thereof coupled to a second transmitting/receiving signal terminal coupled to the antenna switch circuit; a second lowpass filter having one coupling part thereof coupled to the first transmitting/receiving signal terminal; and a second electrostatic capacitor element having one coupling part thereof coupled to the other coupling part of the second lowpass filter, and having the other coupling part thereof coupled to a third transmitting/receiving signal terminal coupled to the antenna switch circuit.

Enumerated below are advantageous effects to be provided according to the representative aspects of the present invention:
(1) In a branching filter, the anti-ESD characteristic and harmonic attenuation characteristic thereof can be enhanced while reducing the circuit size thereof.
(2) Based on the above advantageous effect (1), it is possible to reduce the size of a high-frequency power amplifier module and increase the performance capabilities thereof while realizing reduction in cost.
(3) Based on the above advantageous effects (1) and (2), a communication mobile terminal having higher functional performance can be provided at lower cost.

DETAILED DESCRIPTION OF THE PREFERRED EMBODIMENTS

Figure 1:
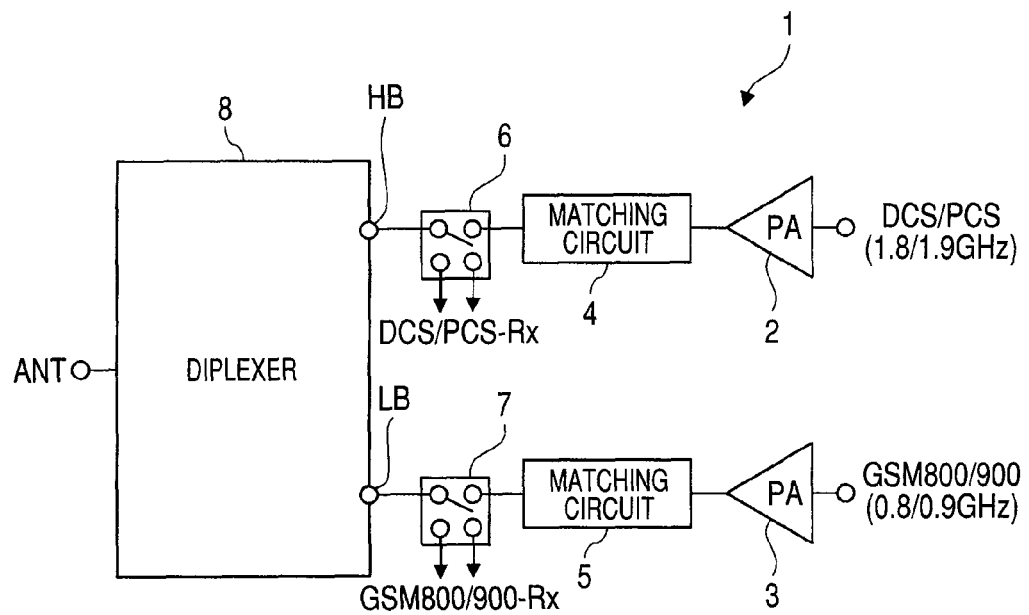
FIG. 1 is a block diagram showing an exemplary configuration of a high-frequency power amplifier module according a preferred embodiment 1 of the present invention.

The present invention will now be described in detail by way of example with reference to the accompanying drawings showing the preferred embodiments thereof. Throughout the accompanying drawings, like reference characters designate like or corresponding parts to avoid repetitive description thereof.

Preferred Embodiment 1

Figure 2:
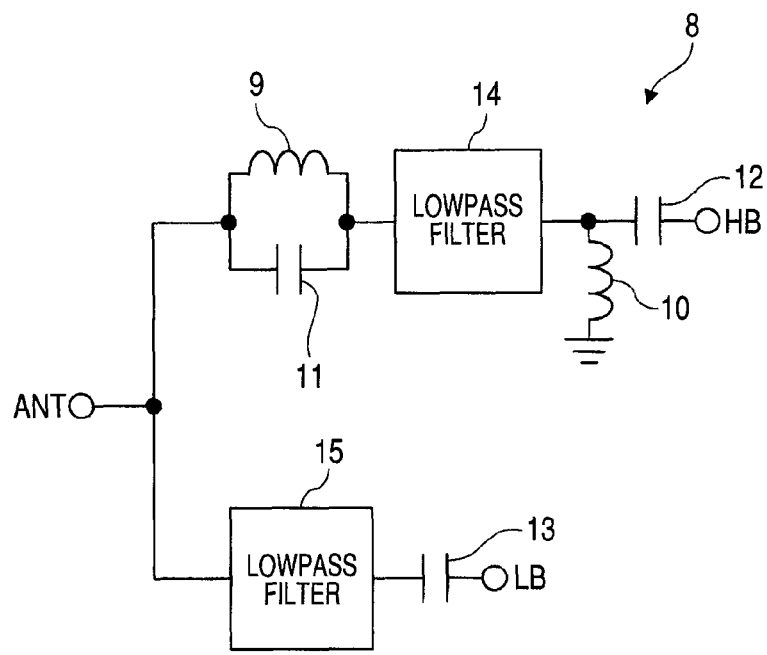
FIG. 2 is an explanatory diagram showing an exemplary configuration of a diplexer included in the high-frequency power amplifier module illustrated in FIG. 1.

FIG. 1 shows a block diagram of an exemplary configuration of a high-frequency power amplifier module according to a preferred embodiment 1 of the present invention, and FIG. 2 shows an explanatory diagram of an exemplary configuration of a diplexer included in the high-frequency power amplifier module illustrated in FIG. 1.

In the present preferred embodiment 1, a high-frequency power amplifier module 1 is a transmission power amplifier module contained in a mobile phone (communication mobile terminal) to be used in a communication system, for example. The high-frequency power amplifier module 1, which is provided in the form of a semiconductor integrated circuit device, comprises output power amplifiers 2 and 3, matching circuits 4 and 5, antenna switch circuits 6 and 7, a diplexer 8, etc.

The output power amplifier 2 is used to amplify transmitting signals in a high frequency band (e.g., DCS/PCS (1.8 GHz band/1.9 GHz band)). The output power amplifier 3 is used to amplify transmitting signals in a low frequency band (e.g., GSM800/GSM900 (800 MHz band/900 MHz band)).

The matching circuits 4 and 5 are used to optimize impedance matching. It is to be noted that although only the matching circuits 4 and 5 are indicated in FIG. 1, there is also provided a matching circuit at each receiving terminal of the antenna switch circuits 6 and 7.

The antenna switch circuit 6 is used for changing over transmitting/receiving signals in the high frequency band, and the antenna circuit 7 is used for changing over transmitting/receiving signal in the low frequency band.

Each of these antenna switch circuits 6 and 7 is an SP3T switch that changes over transmitting/receiving signals in accordance with an input control signal. The diplexer 8 serves as a branching filter used for separating two frequency bands in dual-band communication.

In a high frequency band circuit, a transmitting signal is amplified by the output power amplifier 2 and then input to the antenna switch circuit 6 through the matching circuit 4. The transmitting signal output from the antenna switch circuit 6 is input to a high frequency band terminal HB of the diplexer 8. Thereafter, via an antenna terminal ANT of the diplexer 8, the transmitting signal is output from an antenna. The antenna terminal ANT serves as a first transmitting/receiving signal terminal, and the high frequency band terminal HB serves as a second transmitting/receiving signal terminal.

In a low frequency band circuit, a transmitting signal is amplified by the output power amplifier 3 and then input to the antenna switch 7 through the matching circuit 5. The transmitting signal output from the antenna switch circuit 7 is input to a low frequency band terminal LB of the diplexer 8. Thereafter, via the antenna terminal ANT of the diplexer 8, the transmitting signal is output from the antenna. The low frequency band terminal LB serves a third transmitting/receiving signal terminal.

On signal reception by the antenna, a receiving signal is input to the diplexer 8. In the diplexer 8, the receiving signal is branchingly fed to a particular path according to a frequency band thereof. Then, the receiving signal is branchingly fed to a particular receiving circuit through either one of the antenna switch circuits 6 and 7.

Referring to FIG. 2, there is shown an explanatory diagram of an exemplary configuration of the diplexer 8.

As shown in FIG. 2, the diplexer 8 comprises inductors 9 and 10, electrostatic capacitor elements 11 to 13, and lowpass filters 14 and 15. The antenna terminal ANT is coupled to each of the three coupling parts including one coupling part of the inductor 9 serving as a tank-circuit inductor, one coupling part of the electrostatic capacitor element 11 serving as a tank-circuit electrostatic capacitor element, and one coupling part of the lowpass filter 15.

The other coupling part of the inductor 9 and the other coupling part of the electrostatic capacitor element 11 are coupled to one coupling part of the lowpass filter 14. In this arrangement, a first tank circuit is formed of the inductor 9 and the electrostatic capacitor element 11.

The other coupling part of the lowpass filter 14 is coupled to each of the two coupling parts including one coupling part of the inductor 10 serving as a first inductor and one coupling part of the electrostatic capacitor element 12 serving as a first electrostatic capacitor element. In this arrangement, a high-pass filter is formed of the inductor 10 and the electrostatic capacitor elements 11 and 12. The other coupling part of the inductor 10 is coupled to reference potential GND, and the other coupling part of the electrostatic capacitor element 12 is coupled to the antenna switch circuit 6 via the high frequency band terminal HB serving as the second transmitting/receiving signal terminal.

The other coupling part of the lowpass filter 15 serving as a second lowpass filter is coupled to one coupling part of the electrostatic capacitor element 13 serving as a second electrostatic capacitor element. The other coupling part of the electrostatic capacitor element 13 is coupled to the antenna switch circuit 7 via the low frequency band terminal LB serving as the third transmitting/receiving signal terminal. Each of the lowpass filters 14 and 15 has a common filter configuration based on a combination of a series inductor and a grounding capacitor, for example.

Then, the features of the diplexer 8 according to the present preferred embodiment 1 will be described below.

In the diplexer 8, the lowpass filter 14 is configured to have an input/output end thereof coupled to at least one series inductor. In this arrangement, a composite grounding inductor with respect to the antenna terminal ANT is formed of the inductor 9, the series inductor included in the lowpass filter 14, and the inductor 10.

Since an ESD (ElectroStatic Discharge) signal contains main components thereof belonging to a frequency band of the order of a few hundreds of MHz or lower, the ESD signal is allowed to pass through the lowpass filter 15 almost intact. Under this condition, a function for ESD filtering from the antenna terminal ANT to the antenna switch circuit 7 is provided by using the composite grounding inductor mentioned above and the electrostatic capacitor element 13, thereby making it possible to suppress passage of the ESD signal to the antenna switch circuit 7.

As stated above, without the need to add such an element as an ESD filter in the low frequency band circuit, harmonic suppression in the high frequency band and anti-ESD characteristic enhancement in the low frequency band can be realized just by providing the lowpass filter 14 in the high frequency band circuit. Thus, it is possible to reduce the circuit size while minimizing an increase in the number of parts.

Further, since the diplexer 8 provides a lowpass filtering characteristic in the high frequency band, the diplexer 8 can remove harmonics produced in the high frequency band circuit (output power amplifier 2, antenna switch circuit 6). Therefore, it is possible to eliminate the need for providing a lowpass filter between the output power amplifier 2 and the antenna switch circuit 6 in the high frequency band circuit, for example.

Still further, since harmonics produced in switching operation in the high frequency band circuit can be attenuated, it is possible to employ a lower-cost antenna switch circuit designed for moderate specifications regarding harmonic suppression.

Thus, according to the present preferred embodiment 1, the high-frequency power amplifier module 1 having an enhanced anti-ESD characteristic in the low frequency band can be realized while reducing the circuit size thereof.

Furthermore, owing to the enhancement in anti-ESD characteristic in the low frequency band, it is possible to reduce the rate of electrostatic breakdown of low-frequency-band switches in the production process of mobile phone assembling, for example.

Moreover, since a lower-cost antenna switch circuit designed for moderate specifications regarding harmonic suppression can be employed, it is possible to substantially reduce the cost of the high-frequency power amplifier module 1.

Preferred Embodiment 2

Figure 3:
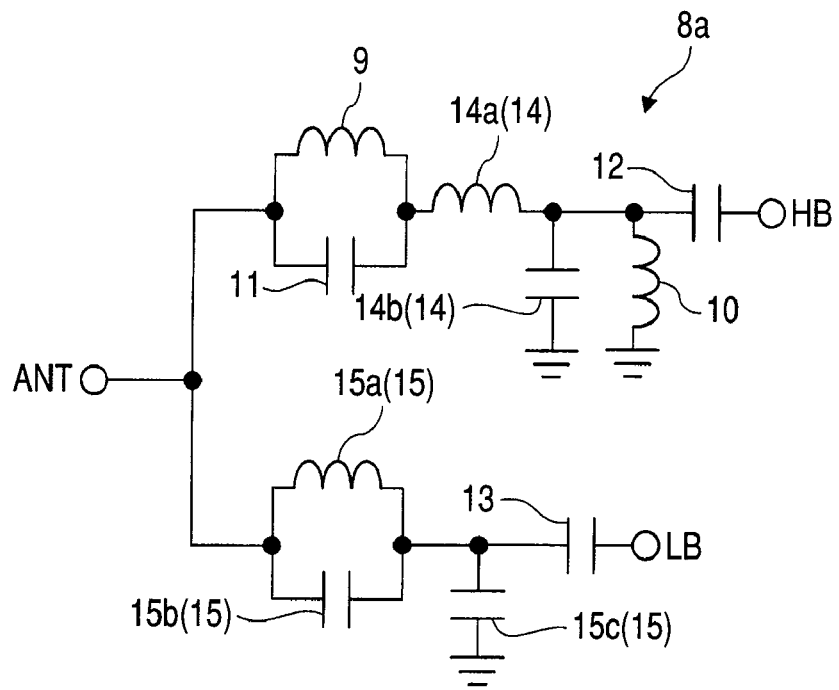
FIG. 3 is an explanatory diagram showing an exemplary configuration of a diplexer according to a preferred embodiment 2 of the present invention.

Referring to FIG. 3, there is shown an exemplary configuration of a diplexer according to a preferred embodiment 2 of the present invention.

In the present preferred embodiment 2, the high-frequency power amplifier module 1 comprises output power amplifiers 2 and 3, matching circuits 4 and 5, antenna switch circuits 6 and 7, a diplexer 8a, etc. in a fashion similar to that in the preferred embodiment 1 (FIG. 1) demonstrated above.

As shown in FIG. 3, the diplexer 8a comprises inductors 9 and 10, electrostatic capacitor elements 11 to 13, and lowpass filters 14 and 15. The lowpass filter 14 comprises an inductor 14a serving as a first filter-circuit inductor and an electrostatic capacitor element 14b serving as a first filter-circuit electrostatic capacitor element, and the lowpass filter 15 comprises an inductor 15a and electrostatic capacitor elements 15b and 15c. Further, a second tank circuit is formed of the inductor 15a and the electrostatic capacitor element 15b.

One coupling part of the inductor 14a is coupled to each coupling part of the inductor 9 and the electrostatic capacitor element 11, and the other coupling part of the inductor 14a is coupled to each of the three coupling parts including one coupling part of the electrostatic capacitor element 14b, one coupling part of the inductor 10, and one coupling part of the electrostatic capacitor element 12. The other coupling part of the electrostatic capacitor element 14b is coupled to reference potential GND.

The antenna terminal ANT is coupled to each of the two coupling parts including one coupling part of the inductor 15a and one coupling part of the electrostatic capacitor element 15b. Each of the other coupling part of the inductor 15a and the other coupling part of the electrostatic capacitor element 15b is coupled to one coupling part of the electrostatic capacitor element 15c serving as a second filter-circuit electrostatic capacitor element and one coupling part of the electrostatic capacitor element 13. The other coupling part of the electrostatic capacitor element 15c is coupled to reference potential GND.

The other coupling arrangements in the present preferred embodiment 2 are similar to those in the preferred embodiment 1 (FIG. 2) demonstrated above, and no repetitive description thereof is given herein.

In the diplexer 8a, a first trap circuit associated with the antenna terminal ANT is formed of the electrostatic capacitor element 11 and the inductor 10 for highpass filtering, and the inductor 14a included in the lowpass filter 14. In addition, a second trap circuit associated with the antenna terminal ANT is formed of the electrostatic capacitor element 11 for highpass filtering, and the inductor 14a and the electrostatic capacitor element 14b included in the lowpass filter 14.

In the first trap circuit and the second trap circuit, each trap frequency is set at a level in the vicinity of a harmonic frequency of the lowpass frequency band circuit (e.g., two-fold higher harmonic, three-fold higher harmonic). In this manner, harmonic output from the low frequency band circuit coupled to the diplexer 8a can be attenuated more effectively.

Thus, according to the present preferred embodiment 2, the high-frequency power amplifier module 1 having an enhanced anti-ESD characteristic in the low frequency band can also be realized while reducing the circuit size thereof.

Further, owing to the enhancement in anti-ESD characteristic in the low frequency band, it is possible to reduce the rate of electrostatic breakdown of low-frequency-band switches in the production process of mobile phone assembling, for example.

Still further, since a lower-cost antenna switch circuit designed for moderate specifications regarding harmonic suppression can be employed, it is possible to substantially reduce the cost of the high-frequency power amplifier module 1.

Preferred Embodiment 3

Figure 4:
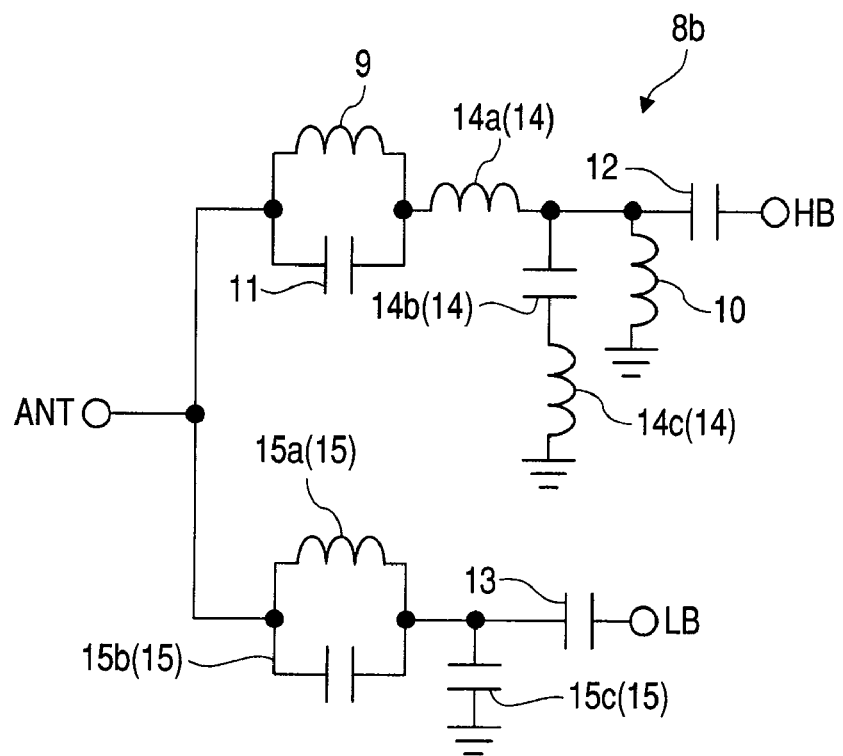
FIG. 4 is an explanatory diagram showing an exemplary configuration of a diplexer according to a preferred embodiment 3 of the present invention.
Figure 5:
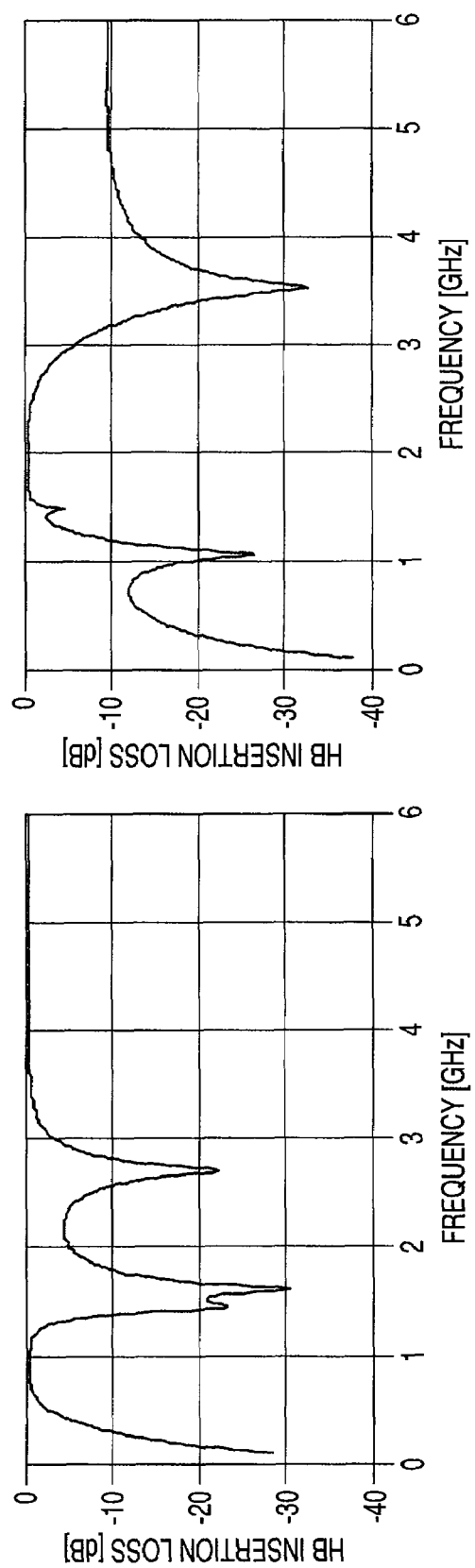
FIG. 5 is an explanatory diagram showing an exemplary frequency characteristic of the diplexer illustrated in FIG. 4.

FIG. 4 shows an explanatory diagram of an exemplary configuration of a diplexer according to a preferred embodiment 3 of the present invention, and FIG. 5 shows an explanatory diagram of an exemplary frequency characteristic of the diplexer illustrated in FIG. 4.

In the present preferred embodiment 3, the high-frequency power amplifier module 1 comprises output power amplifiers 2 and 3, matching circuits 4 and 5, antenna switch circuits 6 and 7, a diplexer 8b, etc. in a fashion similar to that in the foregoing preferred embodiment 1 (FIG. 1).

As shown in FIG. 4, the diplexer 8b comprises inductors 9 and 10, electrostatic capacitor elements 11 to 13, and lowpass filters 14 and 15. In comparison with the preferred embodiment 2 (FIG. 3) demonstrated above in which the lowpass filter 14 comprises an inductor 14a and an electrostatic capacitor element 14b, the lowpass filter 14 in the present preferred embodiment 3 further comprises an inductor 14c serving as a second filter-circuit inductor.

The lowpass filter 15 in the present preferred embodiment 3 comprises an inductor 15a and electrostatic capacitor elements 15b and 15c as in the preferred embodiment 2 (FIG. 3) mentioned above.

One coupling part of the inductor 14c is coupled to a coupling part of the electrostatic capacitor element 14b, and the other coupling part of the inductor 14c is coupled to reference potential GND. The other coupling arrangements in the present preferred embodiment 3 are similar to those in the preferred embodiment 2 (FIG. 3) demonstrated above, and no repetitive description thereof is given herein.

Referring to FIG. 5, there is shown an exemplary frequency characteristic of the diplexer 8b.

In the diplexer 8b, a trap circuit is formed of the electrostatic capacitor element 14b and the inductor 14c. Thus, a trap is made to occur at a frequency of approximately 3.6 GHz in high-frequency-band pass characteristic as shown in FIG. 5.

By matching this trap frequency with a harmonic frequency of an output signal from the high frequency band circuit coupled to the diplexer 8b, harmonic output from the high frequency band circuit can be attenuated more effectively.

In cases where the diplexer 8b is used in a mobile phone designed for quad-band communication including GSM800/GSM900 and DCS/PCS as shown in FIG. 1, the low frequency band terminal LB corresponds to GSM800/GSM900, and the high frequency band terminal HB corresponds to DCS/PCS. In this arrangement, by setting a trap frequency of a trap circuit formed of the electrostatic capacitor element 11 and the inductors 14a and 10 at a level in the vicinity of 1600 MHz, a trap is made to occur in low-frequency-band pass characteristic. Thus, it becomes possible to widen the lower limit side of attenuation band of two-hold harmonics in GSM800/GSM900.

Further, by setting a trap frequency of the trap circuit formed of the electrostatic capacitor element 14b and the inductor 14c at a level in the vicinity of 3600 MHz, an improvement can be made in the amount of attenuation of two-fold harmonics in DCS/PCS with respect to high-frequency-band pass characteristic.

In the above case, the trap circuit formed of the electrostatic capacitor element 14b and the inductor 14c is coupled to the antenna terminal ANT via the electrostatic capacitor element 11 and the inductor 14a. Since the electrostatic capacitor element 11 acts as a substantially through-pass element for DCS/PCS frequencies or higher, a composite circuit thereof is almost equivalent to an LC trap circuit that is configured by coupling the inductor 14a in series with the trap circuit formed of the electrostatic capacitor element 14b and the inductor 14c.

Hence, with an increase in inductance of the inductor 14a, a trap frequency of the composite circuit can be decreased independently of the trap frequency of the trap circuit formed of the electrostatic capacitor element 14b and the inductor 14c.

For example, by setting the trap frequency of the composite circuit at a level in the vicinity of 2700 MHz, an improvement can be made in the amount of attenuation of three-fold harmonics in GSM800/GSM900 with respect to low-frequency-band pass characteristic.

Preferred Embodiment 4

Figure 6:
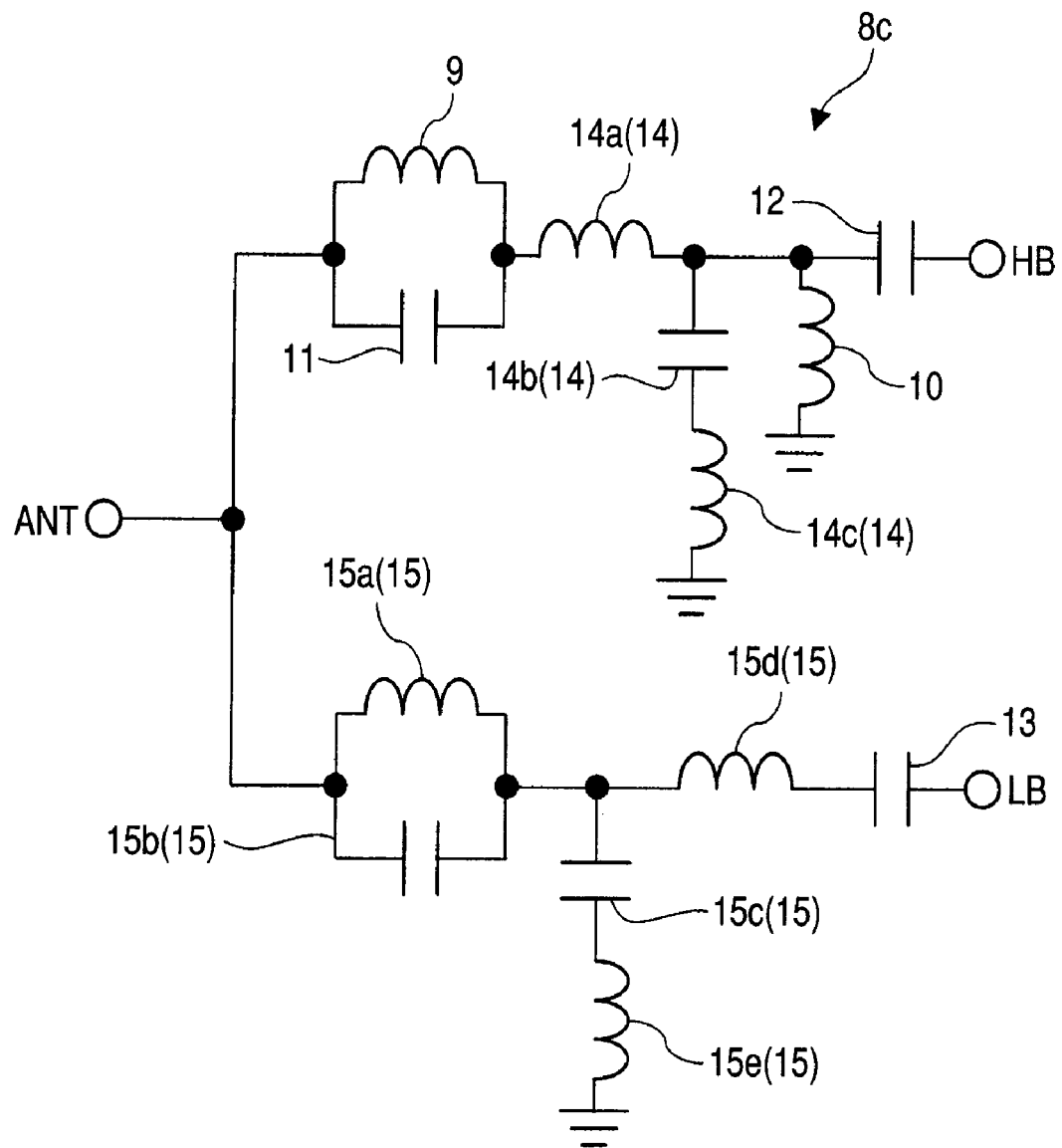
FIG. 6 is an explanatory diagram showing an exemplary configuration of a diplexer according a preferred embodiment 4 of the present invention.
Figure 7:
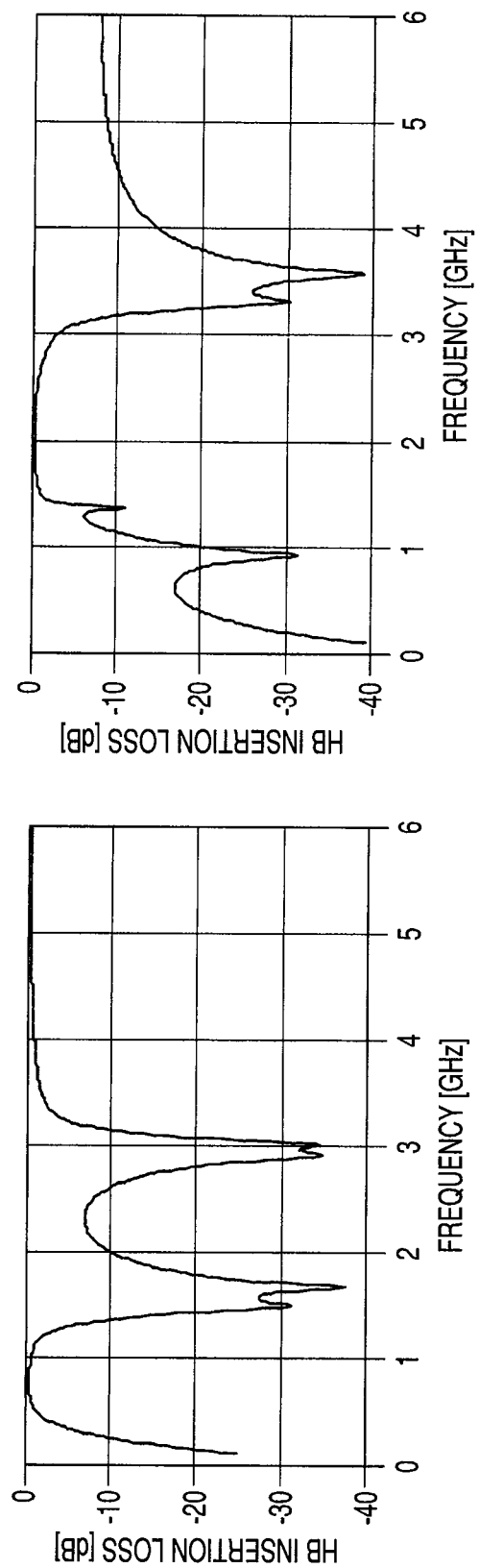
FIG. 7 is an explanatory diagram showing an exemplary frequency characteristic of the diplexer illustrated in FIG. 6.
Figure 8:
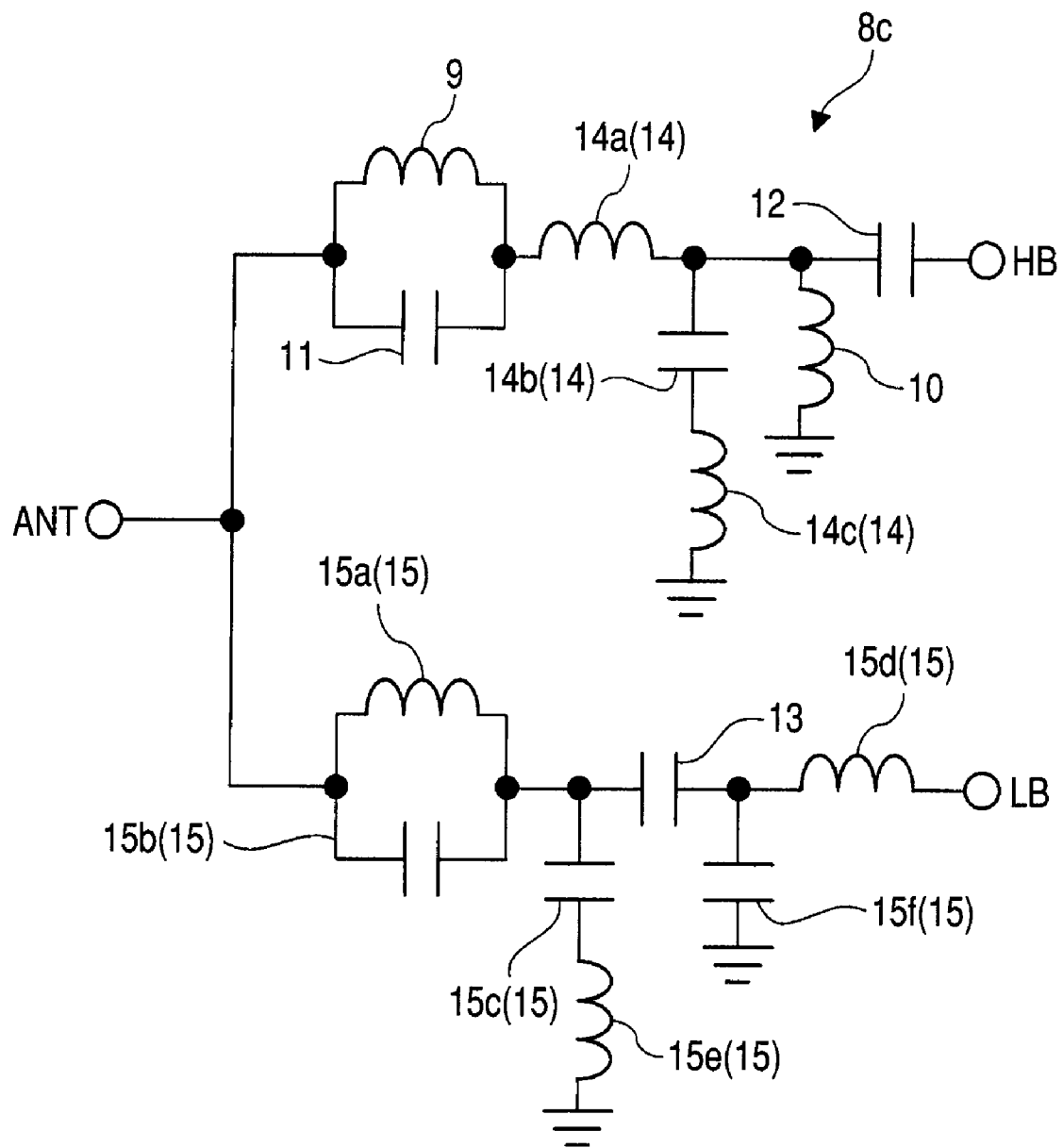
FIG. 8 is an explanatory diagram showing another exemplary configuration of the diplexer according to the preferred embodiment 4 of the present invention.
Figure 9A:
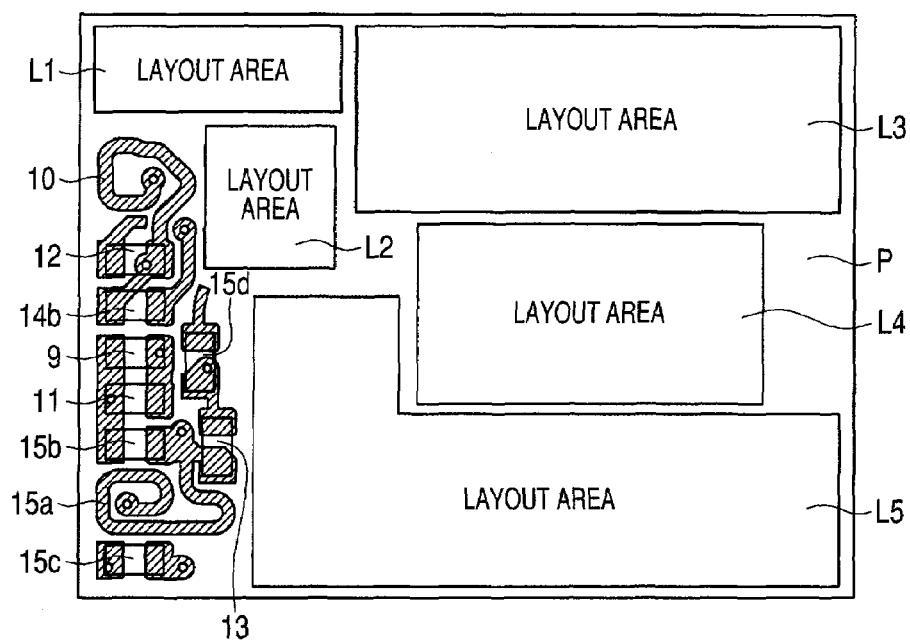
FIGS. 9(a) and 9(b) are explanatory diagrams showing exemplary module substrate layouts of the diplexer illustrated in FIG. 8.
Figure 9B:
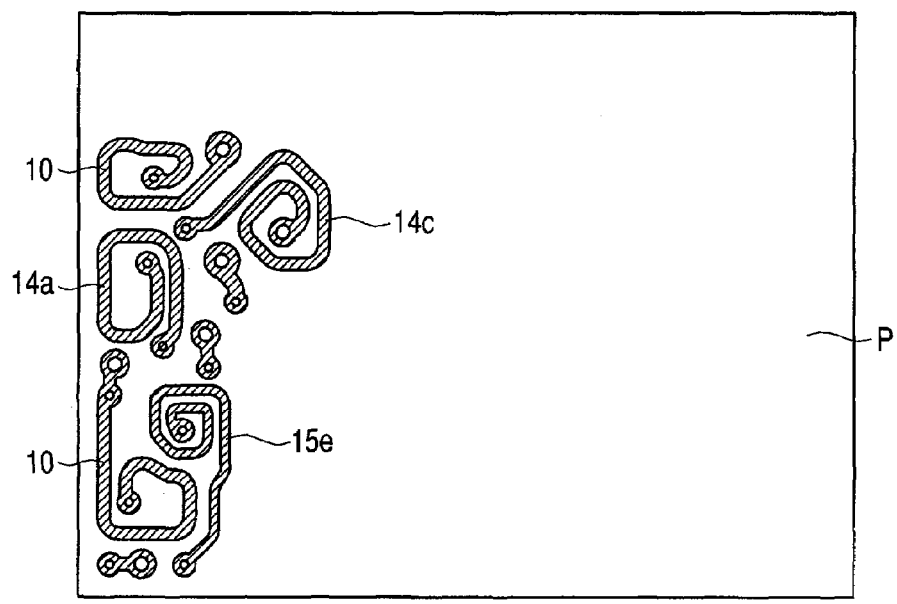

FIG. 6 shows an explanatory diagram of an exemplary configuration of a diplexer according to a preferred embodiment 4 of the present invention, FIG. 7 shows an explanatory diagram of an exemplary frequency characteristic of the diplexer shown in FIG. 6, FIG. 8 shows an exemplary diagram of another exemplary configuration of the diplexer according to the present preferred embodiment 4, and FIGS. 9(a) and 9(b) show explanatory diagrams of exemplary module substrate layouts of the diplexer illustrated in FIG. 8.

In the present preferred embodiment 4, the high-frequency power amplifier module 1 comprises output power amplifiers 2 and 3, matching circuits 4 and 5, antenna switch circuits 6 and 7, a diplexer 8c, etc. in a fashion similar to that in the foregoing preferred embodiment 1 (FIG. 1).

As shown in FIG. 6, the diplexer 8c comprises inductors 9 and 10, electrostatic capacitor elements 11 to 13, and lowpass filters 14 and 15.

The lowpass filter 14 in the present preferred embodiment 4 comprises an inductor 14a, an electrostatic capacitor element 14b, and an inductor 14c as in the preferred embodiment 3 (FIG. 4). In comparison with the foregoing preferred embodiment 2 (FIG. 3) in which the lowpass filter 15 comprises an inductor 15a and electrostatic capacitor elements 15b and 15c, the lowpass filter 15 in the present preferred embodiment 4 further comprises inductors 15d and 15e provided as additional inductors.

One coupling part of the inductor 15d serving as a third filter-circuit inductor is coupled to each coupling part of the inductor 15a, the electrostatic capacitor element 15b, and the electrostatic capacitor element 15c.

The other coupling part of the electrostatic capacitor element 15c is coupled to one coupling part of the inductor 15e serving as a fourth filter-circuit inductor, and the other coupling part of the inductor 15e is coupled to reference potential GND. The other coupling arrangements in the present preferred embodiment 4 are similar to those in the preferred embodiment 3 (FIG. 4) demonstrated above.

In the present preferred embodiment 4, a tank circuit is formed of the inductor 15a and the electrostatic capacitor element 15b, and an LC trap circuit is formed of the electrostatic capacitor element 15c and the inductor 15e.

Owing to the provision of the inductor 15d, an improvement can be made in the amount of high frequency attenuation between the antenna terminal ANT and the low frequency band terminal LB. It is also possible to decrease the electrostatic capacitance of the electrostatic capacitor element 13 used for matching with the low frequency band terminal LB.

Hence, by decreasing the electrostatic capacitance of the electrostatic capacitor element 13, the amount of low frequency attenuation of an ESD filter formed of the electrostatic capacitor element 13 and a composite grounding inductor (formed of the inductors 9, 10, and 14a) with respect to the high frequency band terminal HB can be increased for enhancement in anti-ESD characteristic.

Referring to FIG. 7, there is shown an explanatory diagram of the diplexer 8c.

In the diplexer 8c, a trap circuit formed of the electrostatic capacitor element 15c and the inductor 15e is set so as to attenuate three-fold harmonics in GSM800/GSM900 with respect to low-frequency-band pass characteristic. In frequency-shifted combination with a trap frequency of the trap circuit for three-fold harmonics in GSM800/GSM900, which is formed of the electrostatic capacitor elements 11 and 14b and the inductors 14a and 14c as demonstrated in the above preferred embodiment 3, it is possible to widen the attenuation band of three-fold harmonics.

Further, in view of the lowpass filter 15 of the diplexer 8c from the antenna terminal ANT with respect to a higher frequency band exceeding the frequency level of two-fold harmonics in GSM800/GSM900 (i.e., resonance frequency of the tank circuit formed of the electrostatic capacitor element 15b and the inductor 15a), a composite trap circuit formed of the electrostatic capacitor elements 15b and 15c and the inductor 15e appears to be coupled to the antenna terminal ANT.

This composite trap circuit provides a trap frequency higher than that determined by a combination of the electrostatic capacitor element 15c and the inductor 15e, and the trap frequency of the composite trap circuit can be regulated by adjusting the electrostatic capacitance of the electrostatic capacitor element 15b.

In FIG. 7, the trap frequency of the composite trap circuit is set at a level in the vicinity of 3600 MHz that is approximately equal to the frequency level of two-fold harmonics in DCS/PCS with respect to high-frequency-band pass characteristic. A trap frequency determined by the electrostatic capacitor element 14b and the inductor 14c is set at a level in the vicinity of 3400 MHz which is near the lower limit of the two-fold frequency of DCS band. In combination of these trap frequencies mentioned above, the attenuation band is extended to make it possible to provide wider-band attenuation of two-fold harmonics in DCS/PCS.

Further, while the inductor 15d is coupled between the tank circuit (formed of the inductor 15a and the electrostatic capacitor element 15b in parallel coupling) and the electrostatic capacitor element 13 in the present preferred embodiment 4, there may be provided such an arrangement that the inductor 15d is disposed between the electrostatic capacitor element 13 and the low frequency band terminal LB, for example.

Still further, as shown in FIG. 8, there may also be provided a diplexer 8c wherein the inductor 15d is coupled between the electrostatic capacitor element 13 and the low frequency band terminal LB and wherein an electrostatic capacitor element 15f serving as a grounding capacitor is additionally provided in the lowpass filter 15.

In the above case, one coupling part of the electrostatic capacitor element 15f is coupled to each coupling part of the electrostatic capacitor element 13 and the inductor 15d, and the other coupling part of the electrostatic capacitor element 15f is coupled to reference potential GND.

The provision of such a configuration as mentioned above can improve the matching condition of the low frequency band circuit.

Referring to FIGS. 9(a) and 9(b), there are shown explanatory diagrams of exemplary layouts of the diplexer 8c of FIG. 8 formed over a module substrate P.

The module substrate P is provided as a printed wiring board form containing a plurality of layers (e.g., four layers). FIG. 9(a) shows a layout of a surface layer of the module substrate P, and FIG. 9(b) shows a layout of a second layer of the module substrate P.

As shown in FIG. 9(a), a layout area L1 is provided in the upper left region of the module substrate P, and a layout area L2 is provided to the lower right of layout area L1. The layout area L1 includes signal-reception matching circuit parts except the matching circuits 4 and 5 coupled to the antenna switch circuits 6 and 7, and the layout area L2 includes the antenna switch circuits 6 and 7.

At the right sides of the layout areas L1 and L2, there is provided a layout area L3 in which the matching circuit 4 is formed. At the lower side of the layout area L3, a layout area L4 is provided in which the output power amplifiers 2 and 3 are formed, and at the lower side of the layout area L4, a layout area L5 is provided in which the matching circuit 5 is formed.

Further, at the left side of the layout area L2, the inductor 10 is disposed which is provided as a spiral inductor having a wiring pattern formed over the module substrate P. At the lower side of the inductor 10, the electrostatic capacitor element 12, electrostatic capacitor element 14b, inductor 9, electrostatic capacitor element 11, and electrostatic capacitor element 15b are provided respectively in the upper-to-lower direction.

At the right side of the inductor 9, the inductor 15d is disposed, and at the lower side of the inductor 15d, the electrostatic capacitor element 13 is disposed. The electrostatic capacitor element 12, electrostatic capacitor element 14b, inductor 9, electrostatic capacitor element 11, electrostatic capacitor element 15b, inductor 15d, and electrostatic capacitor element 13 are provided as surface-mounted parts, for example.

At the lower side of the electrostatic capacitor element 15b, the inductor 15a formed as a spiral inductor is disposed, and at the lower side of the inductor 15a, the electrostatic capacitor element 15c formed as a surface-mounted part, for example, is disposed.

As shown in FIG. 9(b), the inductor 10 formed as a spiral inductor is disposed in the upper left region of the module substrate P. At the lower side of the inductor 10, the inductor 14a formed as a spiral inductor is disposed.

At the right sides of the inductors 10 and 14a, the inductor 14c formed as a spiral inductor is disposed. At the lower side of the inductor 14a, the inductor 15e formed as a spiral inductor is disposed, and at the lower side of the inductor 15e, the inductor 10 formed as a spiral inductor is disposed. The electrostatic capacitor element 15f is disposed in a third layer of the module substrate P (not shown).

By providing each of the inductor 14a and other series inductors in the form of a spiral inductor as mentioned above, a further attenuation pole can be produced through self-resonance of capacitance components thereof.

Thus, it is possible to decrease the number of parts for reduction in layout area and reduction in cost while providing enhancement in harmonic attenuation characteristic.

Preferred Embodiment 5

Figure 10:
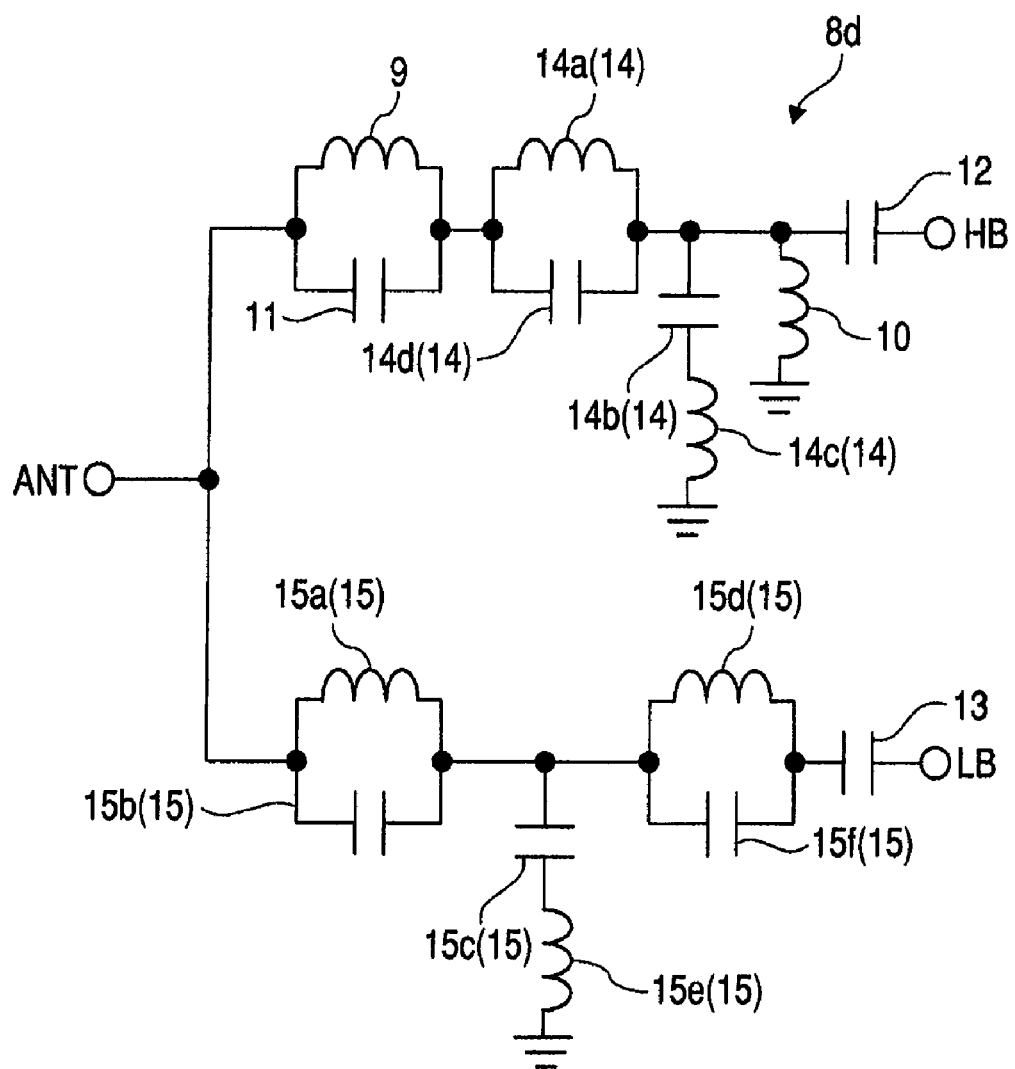
FIG. 10 is an explanatory diagram showing an exemplary configuration of a diplexer according to a preferred embodiment 5 of the present invention.
Figure 11:
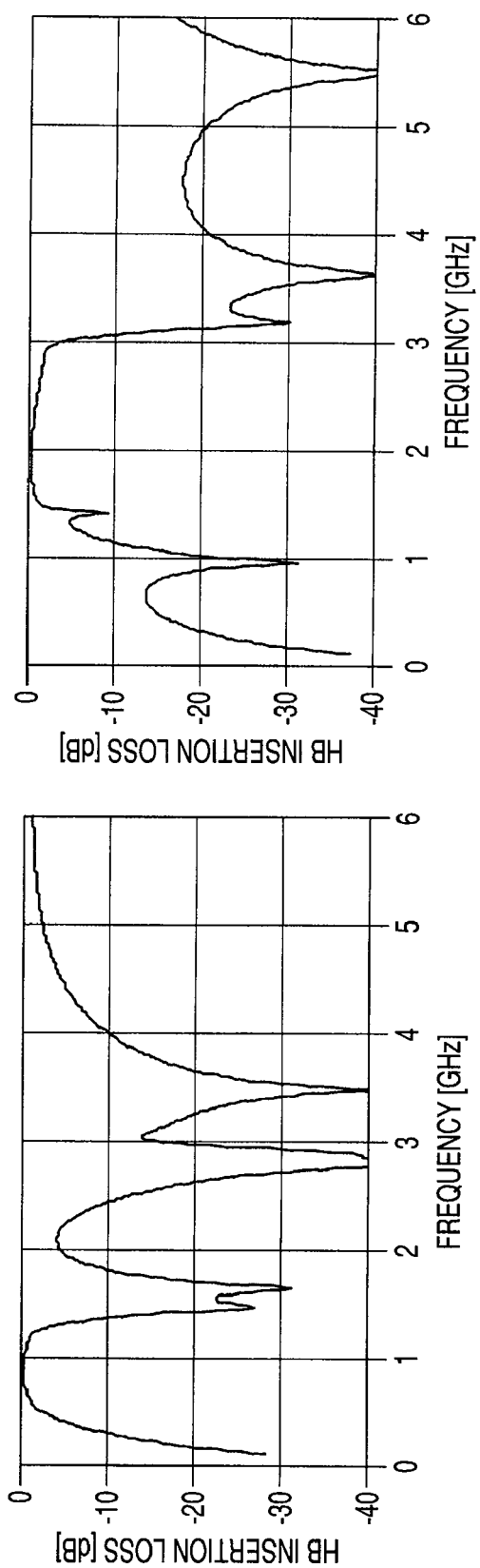
FIG. 11 is an explanatory diagram showing a frequency characteristic of the diplexer illustrated in FIG. 10.

FIG. 10 shows an explanatory diagram of an exemplary configuration of a diplexer according to a preferred embodiment 5 of the present invention, and FIG. 11 shows an explanatory diagram of a frequency characteristic of the diplexer illustrated in FIG. 10.

In the present preferred embodiment 5, the high-frequency power amplifier module 1 comprises output power amplifiers 2 and 3, matching circuits 4 and 5, antenna switch circuits 6 and 7, a diplexer 8d, etc. in a fashion similar to that in the foregoing preferred embodiment 1 (FIG. 1).

As shown in FIG. 10, the diplexer 8d comprises inductors 9 and 10, electrostatic capacitor elements 11 and 12, and lowpass filters 14 and 15. Further, the capacitor element CL3 is provided between the low frequency band terminal LB and the lowpass filter 15.

In comparison with the preferred embodiment 4 (FIG. 6) demonstrated above, the lowpass filter 14 further comprises an electrostatic capacitor element 14d and an electrostatic capacitor element 15f provided as additional elements as shown in FIG. 10. The electrostatic capacitor element 14d included in the lowpass filter 14 is coupled in parallel with the inductor 14a serving as a series inductor, and the electrostatic capacitor element 15f included in the lowpass filter 15 is coupled in parallel with the inductor 15d serving as a series inductor.

Between the antenna terminal ANT and the high frequency band terminal HB in the configuration shown in FIG. 10, a signal cutoff occurs at a resonance frequency of a tank circuit formed of the inductor 14a and the electrostatic capacitor element 14d as shown in FIG. 11. Hence, an attenuation pole is produced at a frequency level in the vicinity of three-fold harmonics in DCS/PCS with respect to high-frequency-band pass characteristic. Likewise, between the antenna terminal ANT and the low frequency band terminal LB, a signal cutoff occurs at a resonance frequency of a tank circuit formed of the inductor 15d and the electrostatic capacitor element 15f. Hence, an attenuation pole is produced at a frequency level in the vicinity of four-fold harmonics in GSM800/GSM900 with respect to low-frequency-band pass characteristic.

For producing an attenuation pole at a relatively high frequency level as mentioned above, it is just required to provide a minuscule degree of electrostatic capacitance by using each of the electrostatic capacitor element 14d and the electrostatic capacitor element 15f. In cases where such series inductors as the inductors 15d and 14a are formed as spiral inductors, the above minuscule degree of electrostatic capacitance can be provided satisfactorily by parasitic capacitance thereof.

Preferred Embodiment 6

Figure 12:
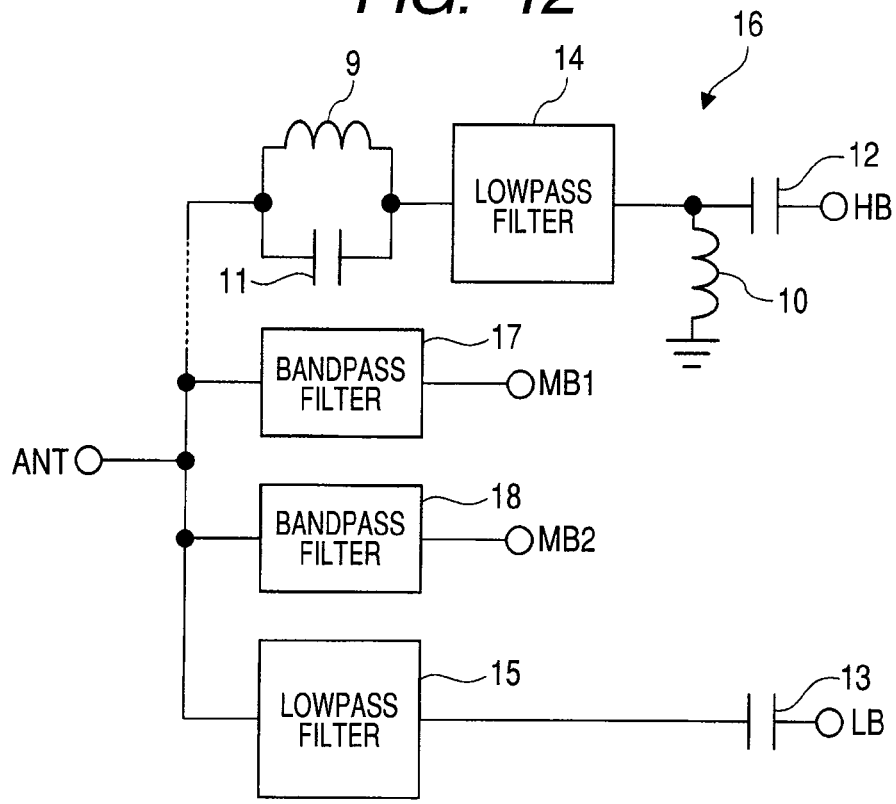
FIG. 12 is an explanatory diagram showing an exemplary configuration of a multiplexer according a preferred embodiment 6 of the present invention.
Figure 13:
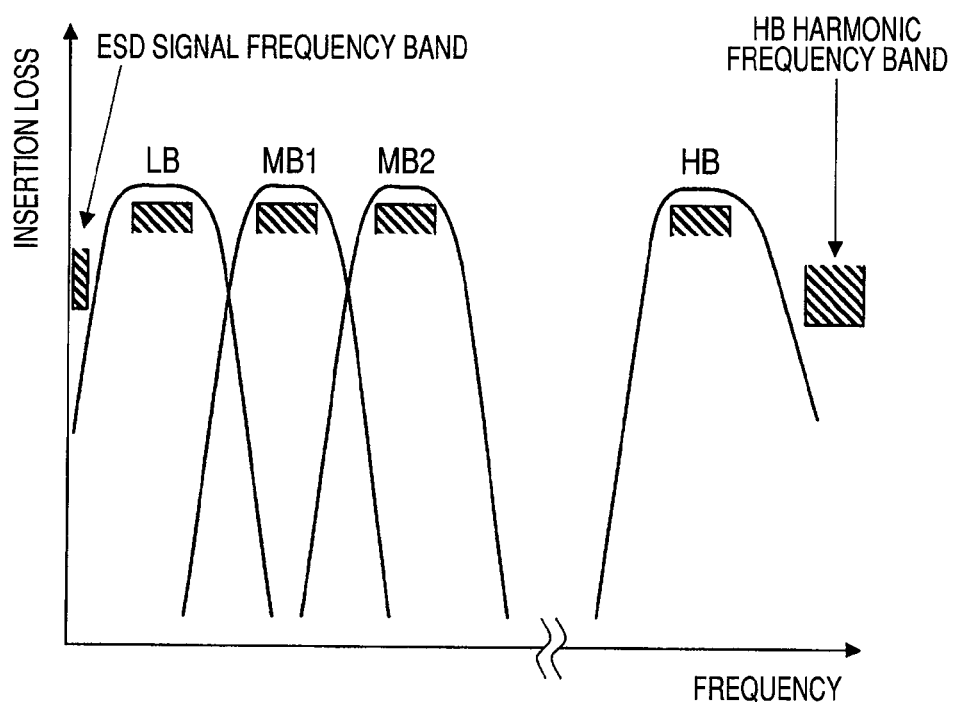
FIG. 13 is an explanatory diagram showing a frequency characteristic of the multiplexer illustrated in FIG. 12.

FIG. 12 shows an explanatory diagram of an exemplary configuration of a multiplexer according to a preferred embodiment 6 of the present invention, and FIG. 13 shows an explanatory diagram of a frequency characteristic of the multiplexer illustrated in FIG. 12.

While the foregoing preferred embodiments 1 to 5 have been described as related to the examples of diplexers, there may also be provided a multiplexer 16 which is a branching filter designed for separating three or more different frequency bands, for example. As shown in FIG. 12, the multiplexer 16 comprises bandpass filters 17 and 18 in addition to the configuration of the diplexer 8 shown in FIG. 2.

The bandpass filters 17 and 18 are provided as filter circuits for allowing passage of signals having higher frequencies than those allowed to pass through the lowpass filter 15. One coupling part of each of these bandpass filters 17 and 18 is coupled to the antenna terminal ANT. The other coupling parts of the bandpass filters 17 and 18 are coupled to medium frequency band terminals MB1 and MB2, respectively.

In the configuration mentioned above, while attenuating harmonic signals in the high frequency band through the lowpass filter 14, a low-frequency-band attenuation characteristic capable of attenuating ESD signals for the circuit coupled to the low frequency band terminal LB can be provided as shown in FIG. 13 by using the electrostatic capacitor element 13 and a composite grounding inductor formed of the inductor 9, the series inductor included in the lowpass filter 14, and the inductor 10.

While the present invention has been described in detail with respect to specific embodiments thereof, it is to be understood that the present invention is not limited by any of the details of description and that various changes and modifications may be made in the present invention without departing from the spirit and scope thereof.

For example, while the high-frequency power amplifier module demonstrated in each of the foregoing preferred embodiments 1 to 5 is of a type designed for quad-band communication, the diplexer according to the present invention is also applicable a high-frequency power amplifier module designed for dual-band communication. Thus, in the manufacture of high-frequency power amplifier modules for dual-band communication, it is possible to decrease the degree of variations in harmonic characteristic due to variations in substrate production, thereby contributing to enhancement in yield.

As regards industrial applicability of the present invention, it will be obvious to those skilled in the art that the present invention is applicable to enhancement in anti-ESD characteristic and suppression of harmonics in branching filters used for communication mobile terminals and the like.

What is claimed is:

1. A branching filter comprising:
    a first tank circuit including a tank-circuit inductor and a tank-circuit electrostatic capacitor element arranged in parallel, the first tank circuit having one coupling part coupled to a first transmitting/receiving signal terminal;
    a first lowpass filter having one coupling part coupled to another coupling part of the first tank circuit;
    a first inductor having one coupling part coupled to another coupling part of the first lowpass filter, and the first inductor having another coupling part coupled to a reference potential;
    a first electrostatic capacitor element having one coupling part coupled to the other coupling part of the first lowpass filter, and the first electrostatic capacitor having another coupling part coupled to a second transmitting/receiving signal terminal;
a second lowpass filter having one coupling part coupled to the first transmitting/receiving signal terminal; and
a second electrostatic capacitor element having one coupling part coupled to another coupling part of the second lowpass filter, and the second electrostatic capacitor having another coupling part coupled to a third transmitting/receiving signal terminal.

2. The branching filter according to claim 1,
wherein the first lowpass filter comprises:
a first filter-circuit inductor having one coupling part coupled to the other coupling part of the first tank circuit; and
a first filter-circuit electrostatic capacitor element having one coupling part coupled to another coupling part of the first filter-circuit inductor, and the first filter-circuit electrostatic capacitor element having another coupling part coupled to the reference potential.

3. The branching filter according to claim 1,
wherein the first lowpass filter comprises:
a first filter-circuit inductor having one coupling part coupled to the other coupling part of the first tank circuit;
a first filter-circuit electrostatic capacitor element having one coupling part coupled to another coupling part of the first filter-circuit inductor; and
a second filter-circuit inductor having one coupling part coupled to the other coupling part of the first filter-circuit electrostatic capacitor element, and the second filter-circuit inductor having another coupling part coupled to the reference potential.

4. The branching filter according to claim 1,
wherein the second lowpass filter comprises:
a second tank circuit including a tank-circuit inductor and a tank-circuit electrostatic capacitor element, the second tank circuit having one coupling part coupled to the first transmitting/receiving signal terminal;
a third filter-circuit inductor having one coupling part coupled to another coupling part of the second tank circuit, and the third filter-circuit inductor having another coupling part coupled to the one coupling part of the first electrostatic capacitor element;
a second filter-circuit electrostatic capacitor element having one coupling part coupled to the other coupling part of the second tank circuit; and
a fourth filter-circuit inductor having one coupling part coupled to another coupling part of the second filter-circuit electrostatic capacitor element, and the fourth filter-circuit inductor having another coupling part coupled to the reference potential.

5. The branching filter according to claim 1,
wherein the second lowpass filter comprises:
a second tank circuit including a tank-circuit inductor and a tank-circuit electrostatic capacitor element arranged in parallel, the second tank circuit having one coupling part coupled to the first transmitting/receiving signal terminal;
a third filter-circuit inductor having one coupling part coupled to the other coupling part of the second electrostatic capacitor element, and the third filter-circuit inductor having another coupling part coupled to the third transmitting/receiving signal terminal;
a second filter-circuit electrostatic capacitor element having one coupling part coupled to another coupling part of the second tank circuit; and
a fourth filter-circuit inductor having one coupling part coupled to another coupling part of the second filter-circuit electrostatic capacitor element, and the fourth filter-circuit inductor having another coupling part coupled to the reference potential.

6. A branching filter for separating at least three frequency bands, the branching filter comprising:
a first tank circuit including a tank-circuit inductor and a tank-circuit electrostatic capacitor element arranged in parallel, the first tank circuit having one coupling part coupled to a first transmitting/receiving signal terminal;
a first lowpass filter having one coupling part coupled to another coupling part of the first tank circuit;
a first inductor having one coupling part coupled to another coupling part of the first lowpass filter, and the first inductor having another coupling part coupled to a reference potential;
a first electrostatic capacitor element having one coupling part coupled to the other coupling part of the first lowpass filter, and the first electrostatic capacitor element having another coupling part coupled to a second transmitting/receiving signal terminal;
a second lowpass filter having one coupling part coupled to the first transmitting/receiving signal terminal;
a second electrostatic capacitor element having one coupling part coupled to another coupling part of the second lowpass filter, and the second electrostatic capacitor element having another coupling part coupled to a third transmitting/receiving signal terminal; and
at least one bandpass filter having one coupling part coupled to the first transmitting/receiving signal terminal, and the at least one bandpass filter having another coupling part coupled to a fourth transmitting/receiving signal terminal for allowing passage of signals having higher frequencies than a frequency band allowed to pass through the second lowpass filter.

7. A semiconductor integrated circuit device including a branching filter, the branching filter comprising:
an antenna switch circuit for changing over signal paths allocated for different frequencies;
a first tank circuit including a tank-circuit inductor and a tank-circuit electrostatic capacitor element arranged in parallel, the first tank circuit having one coupling part coupled to a first transmitting/receiving signal terminal which serves as an antenna terminal coupled to an antenna;
a first lowpass filter having one coupling part coupled to another coupling part of the first tank circuit;
a first inductor having one coupling part coupled to another coupling part of the first lowpass filter, and the first inductor having another coupling part coupled to a reference potential,
a first electrostatic capacitor element having one coupling part coupled to the other coupling part of the first lowpass filter, and the first electrostatic capacitor element having another coupling part coupled to a second transmitting/receiving signal terminal coupled to the antenna switch circuit;
a second lowpass filter having one coupling part coupled to the first transmitting/receiving signal terminal; and
a second electrostatic capacitor element having one coupling part coupled to another coupling part of the second lowpass filter, and the second electrostatic capacitor element having another coupling part coupled to a third transmitting/receiving signal terminal coupled to the antenna switch circuit.

8. The semiconductor integrated circuit device according to claim 7,
wherein the first lowpass filter comprises:
a first filter-circuit inductor having one coupling part coupled to the other coupling part of the first tank circuit; and a first filter-circuit electrostatic capacitor element having one coupling part coupled to another coupling part of the first filter-circuit inductor, and the first filter-circuit electrostatic capacitor element having another coupling part coupled to the reference potential.

9. The semiconductor integrated circuit device according to claim 7,
wherein the first lowpass filter comprises:
a first filter-circuit inductor having one coupling part coupled to the other coupling part of the first tank circuit;
a first filter-circuit electrostatic capacitor element having one coupling part coupled to another coupling part of the first filter-circuit inductor; and
a second filter-circuit inductor having one coupling part coupled to another coupling part of the first filter-circuit electrostatic capacitor element, and the second filter-circuit inductor having another coupling part coupled to the reference potential.

10. The semiconductor integrated circuit device according to claim 7,
wherein the second lowpass filter comprises:
a second tank circuit including a tank-circuit inductor and a tank-circuit electrostatic capacitor element arranged in parallel, the second tank circuit having one coupling part coupled to the first transmitting/receiving signal terminal;
a third filter-circuit inductor having one coupling part coupled to another coupling part of the second tank circuit, and the third filter-circuit inductor having another coupling part coupled to the one coupling part of the first electrostatic capacitor element;
a second filter-circuit electrostatic capacitor element having one coupling part coupled to the other coupling part of the second tank circuit; and
a fourth filter-circuit inductor having one coupling part coupled to another coupling part of the second filter-circuit electrostatic capacitor element, and the fourth filter-circuit inductor having another coupling part coupled to the reference potential.

11. The semiconductor integrated circuit device according to claim 7,
wherein the second lowpass filter comprises:
a second tank circuit including a tank-circuit inductor and a tank-circuit electrostatic capacitor element arranged in parallel, the second tank circuit having one coupling part coupled to the first transmitting/receiving signal terminal;
a third filter-circuit inductor having one coupling part coupled to the other coupling part of the second electrostatic capacitor element, and the third filter-circuit inductor having another coupling part coupled to the third transmitting/receiving signal terminal;
a second filter-circuit electrostatic capacitor element having one coupling part coupled to another coupling part of the second tank circuit; and
a fourth filter-circuit inductor having one coupling part coupled to another coupling part of the second filter-circuit electrostatic capacitor element, and the fourth filter-circuit inductor having another coupling part coupled to the reference potential.

12. The semiconductor integrated circuit device according to claim 7,
wherein at least one of the first to third filter-circuit inductors is formed as a spiral inductor.

13. A communication mobile terminal including a high-frequency power amplifier module for performing power amplification required for signal transmission in a communication system, the high-frequency power amplifier module including a branching filter, the branching filter comprising:
an antenna switch circuit for changing over signal paths allocated for different frequencies;
a first tank circuit including a tank-circuit inductor and a tank-circuit electrostatic capacitor element arranged in parallel, the first tank circuit having one coupling part coupled to a first transmitting/receiving signal terminal which serves as an antenna terminal coupled to an antenna;
a first lowpass filter having one coupling part coupled to another coupling part of the first tank circuit;
a first inductor having one coupling part coupled to the first lowpass filter, and the first inductor having another coupling part coupled to a reference potential;
a first electrostatic capacitor element having one coupling part coupled to another coupling part of the first lowpass filter, and the first electrostatic capacitor element having another coupling part coupled to a second transmitting/receiving signal terminal coupled to the antenna switch circuit;
a second lowpass filter having one coupling part coupled to the first transmitting/receiving signal terminal; and
a second electrostatic capacitor element having one coupling part coupled to another coupling part of the second lowpass filter, and the second electrostatic capacitor element having another coupling part coupled to a third transmitting/receiving signal terminal coupled to the antenna switch circuit.

14. The communication mobile terminal according to claim 13,
wherein the first lowpass filter comprises:
a first filter-circuit inductor having one coupling part coupled to the other coupling part of the first tank circuit; and
a first filter-circuit electrostatic capacitor element having one coupling part coupled to another coupling part of the first filter-circuit inductor, and the first filter-circuit electrostatic capacitor element having another coupling part coupled to the reference potential.

15. The communication mobile terminal according to claim 13,
wherein the second lowpass filter comprises:
a second tank circuit including a tank-circuit inductor and a tank-circuit electrostatic capacitor element arranged in parallel, the second tank circuit having one coupling part coupled to the first transmitting/receiving signal terminal;
a third filter-circuit inductor having one coupling part coupled to another coupling part of the second tank circuit, and the third filter-circuit inductor having another coupling part coupled to the one coupling part of the first electrostatic capacitor element;
a second filter-circuit electrostatic capacitor element having one coupling part coupled to the other coupling part of the second tank circuit; and
a fourth filter-circuit inductor having one coupling part coupled to another coupling part of the second filter-circuit electrostatic capacitor element, and the fourth filter-circuit inductor having another coupling part coupled to the reference potential.

* * * * *